US009281888B1

(12) United States Patent
Mu (10) Patent No.: US 9,281,888 B1
(45) Date of Patent: Mar. 8, 2016

(54) QUADRATURE SIGNAL GENERATOR, BEAMFORMING ARRANGEMENT, COMMUNICATION DEVICE AND BASE STATION

(71) Applicant: Telefonaktiebolaget L M Ericsson (publ), Stockholm (SE)

(72) Inventor: Fenghao Mu, Hjärup (SE)

(73) Assignee: TELEFONAKTIEBOLAGET L M ERICSSON (PUBL), Stockholm (SE)

( * ) Notice: Subject to any disclaimer, the term of this patent is extended or adjusted under 35 U.S.C. 154(b) by 0 days.

(21) Appl. No.: 14/422,250

(22) PCT Filed: Dec. 2, 2014

(86) PCT No.: PCT/EP2014/076289
§ 371 (c)(1),
(2) Date: Feb. 18, 2015

(51) Int. Cl.
| | |
|---|---|
| *H04B 7/02* | (2006.01) |
| *H04B 7/06* | (2006.01) |
| *H04L 27/26* | (2006.01) |
| *H04W 72/04* | (2009.01) |
| *H04W 88/08* | (2009.01) |
| *H03H 7/01* | (2006.01) |
| *H03H 7/21* | (2006.01) |
| *H03H 21/00* | (2006.01) |
| *H03H 11/04* | (2006.01) |

(Continued)

(52) U.S. Cl.
CPC .......... *H04B 7/0617* (2013.01); *H04L 27/2631* (2013.01); *H04W 72/046* (2013.01); *H03H 7/21* (2013.01); *H03H 11/1291* (2013.01); *H03H 11/22* (2013.01); *H03H 21/0012* (2013.01); *H03H 2007/0192* (2013.01); *H03H 2011/0494* (2013.01); *H04W 88/08* (2013.01)

(58) Field of Classification Search
CPC .................. H03H 2011/0494; H03H 11/1291; H03H 21/0001; H03H 21/0012; H03H 11/22; H03H 2007/0192; H03H 7/21; H03H 7/06; H03B 2200/0078
USPC ................... 455/323, 307; 327/552; 333/172; 375/219, 267

See application file for complete search history.

(56) References Cited

U.S. PATENT DOCUMENTS

| 5,854,974 | A | 12/1998 | Li |
| 6,836,180 | B1 | 12/2004 | Kwok |
| 7,190,942 | B1 * | 3/2007 | Nise ......................... H03H 7/18 333/172 |

(Continued)

FOREIGN PATENT DOCUMENTS

EP     1154569 B1     11/2004

OTHER PUBLICATIONS

Kim, S., et al., "An Improved Wideband All-Pass I/Q Network for Millimeter-Wave Phase Shifters", IEEE Transactions on Microwave Theory and Techniques, Nov. 10, 2012, pp. 3431-3439, vol. 60 , Issue: 11, IEEE.

*Primary Examiner* — Leila Malek
(74) *Attorney, Agent, or Firm* — Coats & Bennett, PLLC (57) ABSTRACT

A quadrature signal generator comprises a resistor-capacitor, RC, polyphase filter and an inductor compensation arrangement. The inductor compensation arrangement comprises a first inductor connected between the first and the third output terminals, and a second inductor connected between the second and fourth output terminals. The first and second inductors are arranged to compensate for a capacitive load on the output terminals when in use. A beamforming arrangement, a communication device and a base station are also disclosed.

16 Claims, 4 Drawing Sheets

(51) Int. Cl.
*H03H 11/12* (2006.01)
*H03H 11/22* (2006.01)

(56) References Cited

U.S. PATENT DOCUMENTS

| | | | |
|---|---|---|---|
| 8,412,141 | B2 | 4/2013 | Savoj |
| 8,552,782 | B1 | 10/2013 | Trueheart et al. |
| 2004/0091053 | A1* | 5/2004 | Bargroff .......... H03D 7/18 375/257 |
| 2004/0257129 | A1* | 12/2004 | Kwok .......... H03B 19/00 327/116 |
| 2004/0257152 | A1* | 12/2004 | Kwok .......... H03H 11/22 327/552 |
| 2007/0285307 | A1* | 12/2007 | Nishijima .......... G01S 7/03 342/200 |
| 2008/0020728 | A1* | 1/2008 | Zhuo .......... H03D 7/1441 455/313 |
| 2013/0099871 | A1* | 4/2013 | Wang .......... H03K 3/0315 331/57 |
| 2014/0176259 | A1 | 6/2014 | Reynaert et al. |

* cited by examiner

— Return loss corresponding to circuit according to Fig. 3
------ Return loss corresponding to circuit according to Fig. 1

QUADRATURE SIGNAL GENERATOR, BEAMFORMING ARRANGEMENT, COMMUNICATION DEVICE AND BASE STATION

TECHNICAL FIELD

The present invention generally relates to a quadrature signal generator for radio frequency, RF, signal and to its applications in an RF beamforming arrangement, a communication device and a base station. The present invention relates in particular to inductive compensation of polyphase filters in the apparatuses mentioned above.

BACKGROUND

Generation of different phases of a signal may be desired in several solutions. One of them are for providing beamforming of a radio frequency, RF, signal received or transmitted using a plurality of antennas.

Different phases of a signal may be provided by for example delay transmission lines, which has the drawbacks of consuming a fairly large area and that a difference in insertion loss between a signal that has passed through the delay transmission line and one that has not, and they will become different in amplitude.

Another way is to use an all path LCR filter to generate the different phase versions. Insertion loss is low in such an arrangement. However, such a solution is sensitive to circuitry connected to the respective outputs and the capacitive load thereof, which may ruin phase and amplitude balances of the phase versions of the signal.

Figure 1:
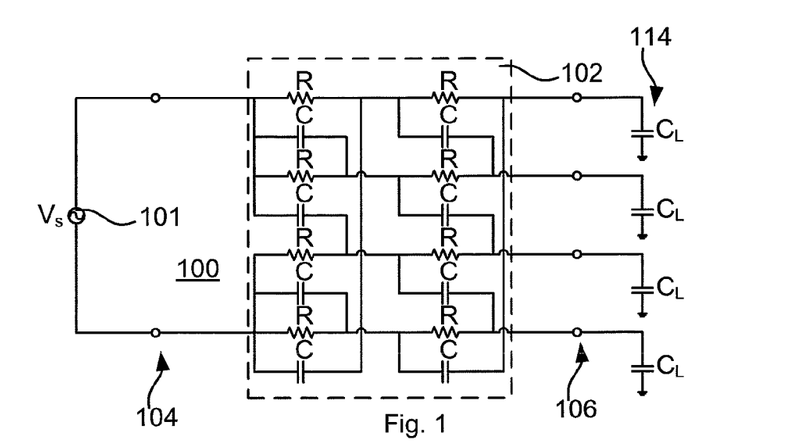
FIG. 1 illustrates a conventional polyphase filter arrangement.

Another way is to use a polyphase filter, for example a polyphase filter 102 as illustrated in FIG. 1. A signal source 101, e.g. an antenna and low-noise amplifier, provides a signal to an input 104 of the polyphase filter 102 and a multiple output of the polyphase filter 102, having terminals 106 each providing different phase versions of the signal, provides the output to a respective load 114, here indicated by respective capacitive load 114.

It is therefore a desire to find a good solution for providing different phases of a signal.

SUMMARY

The inventor has found that a problem with conventional polyphase filters, as shown with reference to FIG. 1, is insertion loss, which may require compensation by higher gain in stages before and/or after the polyphase filter 102, which in turn may cause other problems, e.g. linearity issues, noise figure, etc. Embodiments of the present invention is based on an understanding that a polyphase filter solution with an inductor compensation arrangement connected at the output terminals and arranged to compensate for a capacitive load on the output terminals may provide a relatively low insertion loss.

According to a first aspect, there is provided a quadrature signal generator comprising a resistor-capacitor, RC, polyphase filter and an inductor compensation arrangement. The RC polyphase filter has a first and a second input terminal, and a first, a second, a third and a fourth output terminal, and the RC polyphase filter comprises a plurality of cascade-connected stages of RC units, each RC unit having resistive element and a capacitive element. A first end of each resistive element is set as an input, and a second end of each resistive element is set as an output for the respective stage. The capacitive element of each RC unit is connected between the second end of the resistive element of that RC unit and the first end of the resistive element of a next one of the RC units, and the capacitive element of a last one of the RC units is connected between the second end of the resistive element of the last one of the RC units of the stage and the first end of the resistive element of a first one of the RC units of the stage. The plurality of cascade-connected stages comprises an input stage connected to the first and second input terminals and an output stage connected to the first, second, third and fourth output terminals. The inductor compensation arrangement is connected at the output terminals. The inductor compensation arrangement comprises a first inductor connected between the first and the third output terminals, and a second inductor connected between the second and fourth output terminals.

The first and second inductors of the inductor compensation arrangement may be arranged to compensate for a capacitive load, at an operating frequency, such that there is provided only resistive impedance at the first, second, third and fourth output terminals by resonating with the capacitive elements of the RC polyphase filter and the capacitive load. When each resistive element of the RC units of the RC polyphase filter has a resistance R, and each capacitive element of the RC units of the RC polyphase filter has a capacitance C, the first and second inductors may each have an inductance $L_o$ which is $$\frac{1}{0.5(C + C_L)\omega^2},$$

$\omega$ is the angular frequency of the operating frequency and $C_L$ is the expected capacitive load on each output terminal.

The quadrature signal generator may comprise a second inductor compensation arrangement connected at the input terminals. The second inductor compensation arrangement may comprise an input inductor connected between the first and the second input terminals. The inductor of the second inductor compensation arrangement may be arranged to compensate for a capacitance at the input terminals, at an operating frequency, such that there is provided only resistive impedance at the first and second input terminals by resonating with capacitive elements of the RC polyphase filter and the capacitance at the input terminals. When each resistor of the RC units of the RC polyphase filter has a resistance R, and each capacitor of the RC filters of the RC polyphase filter has a capacitance C, the input inductor may have an inductance L which is $$\frac{1}{(C + C_{in})\omega^2},$$

$\omega$ is the angular frequency of the operating frequency and $C_{in}$ is the expected capacitance to ground on each input terminal.

The first input terminal may be arranged to receive a first polarity of a signal of the radio frequency signal path, the second input terminal may be arranged to receive a second polarity of the signal, the first output terminal may be arranged to output a first polarity of an in-phase version of the signal, the second output terminal may be arranged to output a first polarity of a quadrature-phase version of the signal, the third output terminal may be arranged to output a second polarity of the in-phase version of the signal, and the fourth output terminal may be arranged to output a second polarity of the quadrature-phase version of the signal.

According to a second aspect, there is provided a beamforming arrangement arranged to be connected to an antenna array. The beamforming arrangement comprises a vector modulator comprising an amplifier and a phase rotator connected to each quadrature signal generator, wherein the amplifier and phase rotator are arranged to be controlled according to beamforming control scheme. The phase rotator comprises a quadrature signal generator according to the first aspect.

According to a third aspect, there is provided a communication device comprising a beamforming arrangement according to the second aspect.

The communication device may be a base station arranged for cellular or point-to-point communication.

Other objectives, features and advantages of the present invention will appear from the following detailed disclosure, from the attached dependent claims as well as from the drawings. Generally, all terms used in the claims are to be interpreted according to their ordinary meaning in the technical field, unless explicitly defined otherwise herein. All references to "a/an/the [element, device, component, means, step, etc]" are to be interpreted openly as referring to at least one instance of said element, device, component, means, step, etc., unless explicitly stated otherwise. The steps of any method disclosed herein do not have to be performed in the exact order disclosed, unless explicitly stated.

BRIEF DESCRIPTION OF THE DRAWINGS

The above, as well as additional objects, features and advantages of the present invention, will be better understood through the following illustrative and non-limiting detailed description of preferred embodiments of the present invention, with reference to the appended drawings.

DETAILED DESCRIPTION

A number of polyphase filter arrangements will be demonstrated below. The polyphase filter arrangements are suitable for radio frequency, RF, operation, and their benefits will be evident to the skilled person within RF technology from the description below, particularly for high frequency operation, i.e. one or several GHz.

Figure 2:
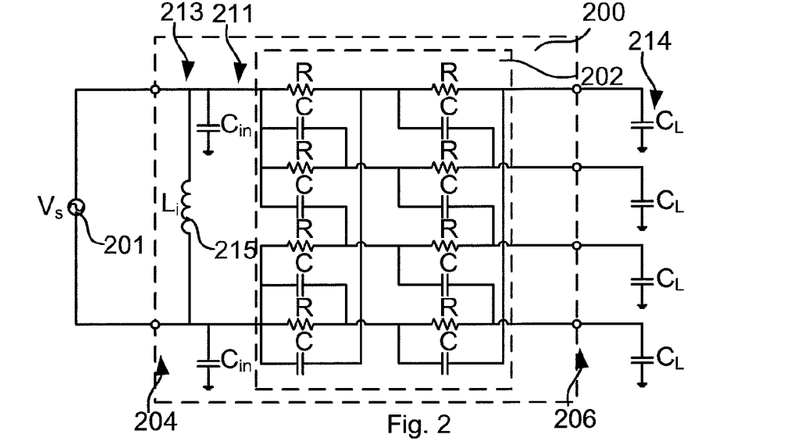
FIG. 2 illustrates a polyphase filter arrangement with an inductor compensation arrangement connected at the input terminals of the polyphase filter.

FIG. 2 illustrates a polyphase filter arrangement 200 with an inductor compensation arrangement 213 connected at input terminals 204 of a polyphase filter 202. The polyphase filter 202 is a resistor-capacitor, RC, polyphase filter having a first and a second input terminal 204, and a first, a second, a third and a fourth output terminal 206, and the RC polyphase filter comprises a plurality of cascade-connected stages of RC units, each of the RC units having a resistive element and a capacitive element connected alternately cyclically. That is, a first end of each resistive element of the respective RC unit is set as an input, and a second end of each resistive element being set as an output for the respective stage. The capacitive element of each RC unit is connected between the second end of the resistive element of that RC unit and the first end of the resistive element of the next RC unit, and so on, wherein the capacitive element of a last RC unit is connected between the second end of the resistive element of the last RC unit of the stage and the first end of the resistive element of the first of the RC units of the stage such that the capacitive elements are arranged alternately cyclically among the plurality of RC units.

Two or more stages may be present. The stages may be dimensioned equally, as indicated in FIGS. 1 to 6, or be dimensioned differently where there is a purpose to match impedances to circuits connected to inputs and outputs of the RC polyphase filter 202. For providing a quadrature signal generator by the polyphase filter arrangement 200, each stage needs four RC units, as illustrated in FIG. 2. This applies also for the polyphase filters and polyphase filter arrangements demonstrated below with reference to FIGS. 3 to 6.

The plurality of cascade-connected stages comprises an input stage connected to the first and second input terminals 204 and an output stage connected to the first, second, third and fourth output terminals 206. A signal source 201, e.g. an antenna and low-noise amplifier, LNA, provides a signal to the input 204 of the polyphase filter 202 and a multiple output of the polyphase filter 202, having terminals 206 each providing different phase versions of the signal, provides the output to a respective load 214, here indicated by respective capacitive load 214, e.g. the input capacitance of a following stage. Further, at the input of the polyphase filter 202, there exist more or less parasitic capacitances 211, which for example may emanate from output capacitance of an LNA of the voltage source 201. To reduce insertion loss, an inductor compensation arrangement 213 is connected at the input of the polyphase filter 202. The inductor compensation arrangement 213 is arranged to compensate for capacitance at the input of the polyphase filter 202 at operating frequency by causing a resonance at the operating frequency. The inductor compensation arrangement 213 may comprise an inductor 215 connected between the input terminals 204. The inductor 215 may thus be dimensioned as $$L_i = \frac{1}{(C+C_{in})\omega^2},$$

where $L_i$ is the inductance of the inductor 215 at the input terminals 204, $\omega$ is the angular frequency of the operating frequency, i.e. $\omega=2\pi f$, where f is the operating frequency, C is the capacitance of the capacitive element of each RC unit of the polyphase filter 202, and $C_{in}$ is the parasitic capacitance present at each input terminal 204.

The input impedance will thus, at the operating frequency, be purely resistive, i.e. reactance is negligible in practice, and insertion loss due to any capacitance at the input will be reduced.

Figure 3:
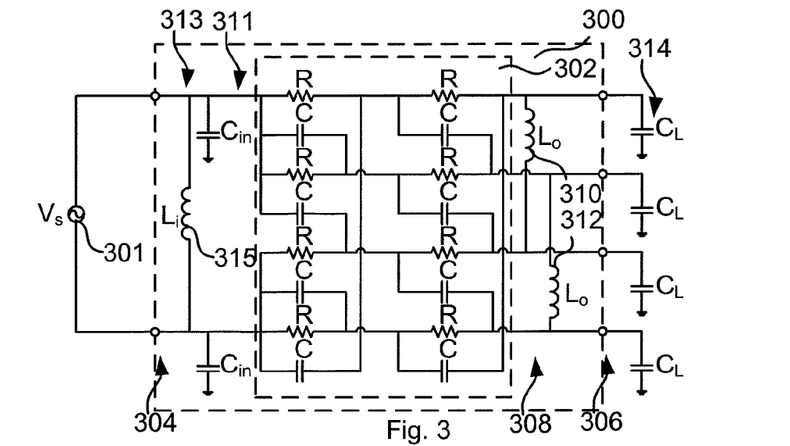
FIG. 3 illustrates a polyphase filter arrangement with inductor compensation arrangements connected at respective input and output terminals of the polyphase filter.

FIG. 3 illustrates a polyphase filter arrangement 300 with inductor compensation arrangements 313, 308 connected at respective input and output terminals 304, 306 of a polyphase filter 302. As in FIG. 2, the polyphase filter 302 is a resistor-capacitor, RC, polyphase filter having the first and the second input terminals 304, and the first, a second, a third and a fourth output terminals 306, and the RC polyphase filter comprises a plurality of cascade-connected stages of RC units, each RC unit having a resistive element and a capacitive element connected alternately cyclically similar to the structure demonstrated with reference to FIG. 2. The plurality of cascade-connected stages comprises an input stage connected to the first and second input terminals 304 and an output stage connected to the first, second, third and fourth output terminals 306. A signal source 301, e.g. an antenna and an LNA, provides a signal to the input 304 of the polyphase filter 302 and a multiple output of the polyphase filter 302, having the terminals 306 each providing different phase versions of the signal, provides the output to a respective load 314, here indicated by respective capacitive load 314, e.g. the input capacitance of a following stage. Further, at the input of the polyphase filter 302, there exists more or less parasitic capacitances 311, which for example may emanate from output capacitance of an LNA of the voltage source 301. To reduce insertion loss, an input inductor compensation arrangement 313 is connected at the input of the polyphase filter 302. The input inductor compensation arrangement 313 is arranged to compensate for capacitance at the input of the polyphase filter 302 at operating frequency by causing a resonance at the operating frequency. The input inductor compensation arrangement 313 may comprise an inductor 315 connected between the input terminals 304. The inductor 315 may thus be dimensioned as $$L_i = \frac{1}{(C + C_{in})\omega^2},$$

where $L_i$ is the inductance of the inductor 315 at the input terminals 304, $\omega$ depends on the operating frequency as $\omega=2\pi f$, where f is the operating frequency, C is the capacitance of the capacitive element of each RC unit of the polyphase filter 302, and $C_{in}$ is the parasitic capacitance present at each input terminal 304.

Furthermore, the polyphase filter arrangement 300 comprises an output inductor compensation arrangement 308. To further reduce insertion loss, the output inductor compensation arrangement 308 is connected at the output of the polyphase filter 302. The output inductor compensation arrangement 308 is arranged to compensate for capacitance at the output of the polyphase filter 302 at operating frequency by causing a resonance at the operating frequency. The output inductor compensation arrangement 308 may comprise a first inductor 310 connected between the first and third output terminals and a second inductor 312 connected between the second and fourth output terminals. The first and second inductors 310, 312 may thus be dimensioned as $$L_o = \frac{1}{0.5(C + C_L)\omega^2},$$

where $L_o$ is the inductance of the respective inductor 308 at the output terminals 306, $\omega$ is the angular frequency of the operating frequency, i.e. $\omega=2\pi f$, where f is the operating frequency, C is the capacitance of the capacitive element of each first order RC filter of the polyphase filter 302, and $C_L$ is the load capacitance present at each output terminal 306.

Figure 8:
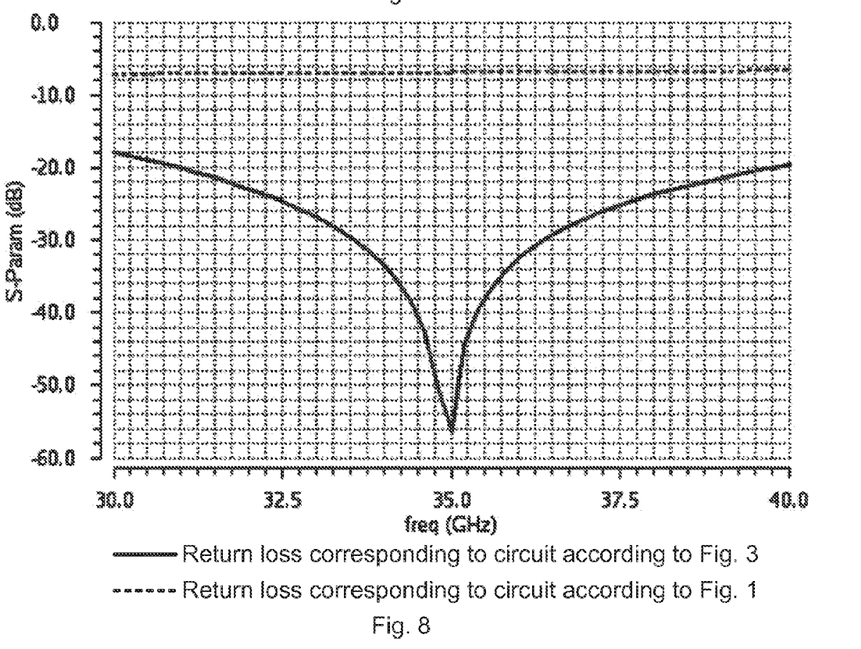
FIG. 8 is a diagram illustrating a return loss plot comparing arrangements of FIGS. 1 and 3.

Both the input and output impedances will thus, at the operating frequency, be purely resistive, i.e. reactance is negligible in practice, and insertion loss due to any capacitance at the input and output will be reduced. FIG. 8 is a diagram illustrating a return loss plot comparing arrangements of FIGS. 1 and 3. The dashed line indicates the return loss for a non-compensated polyphase filter 102 as of FIG. 1 and the solid line indicates the return loss for a compensated polyphase filter arrangement 300 as of FIG. 3. Considering an operating frequency at 35 GHz, it can be seen in the diagram that the difference in return loss would be about 50 dB.

Figure 4:
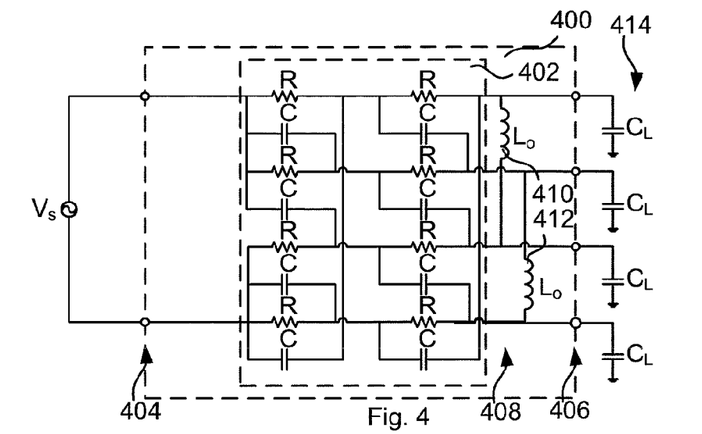
FIG. 4 illustrates a polyphase filter arrangement with an inductor compensation arrangement connected at output terminals of the polyphase filter.

FIG. 4 illustrates a polyphase filter arrangement 400 with an inductor compensation arrangement 408 connected at output terminals 406 of a polyphase filter 402. The polyphase filter arrangement 400 comprises similar elements as the polyphase filter arrangement 300 of FIG. 3, but without the input inductor compensation arrangement 313. The output inductor compensation arrangement 408 may comprise a first inductor 410 connected between the first and third output terminals and a second inductor 412 connected between the second and fourth output terminals. The effect is also similar, although not as emphasized as for the polyphase filter arrangement 300 of FIG. 3. The output impedance will thus, at the operating frequency, be purely resistive, i.e. reactance is negligible in practice, and insertion loss due to capacitance of the capacitive element of each RC unit of the polyphase filter 402 and load capacitance 414 at the output will be reduced. The polyphase filter arrangement 400 may be a beneficial choice for implementations where parasitic capacitances present at the input of the polyphase filter arrangement 400 may be low, e.g. depending on choice of stage connected to the input terminals 404, wherein circuit area for any input inductor compensation arrangement may be saved.

Figure 5:
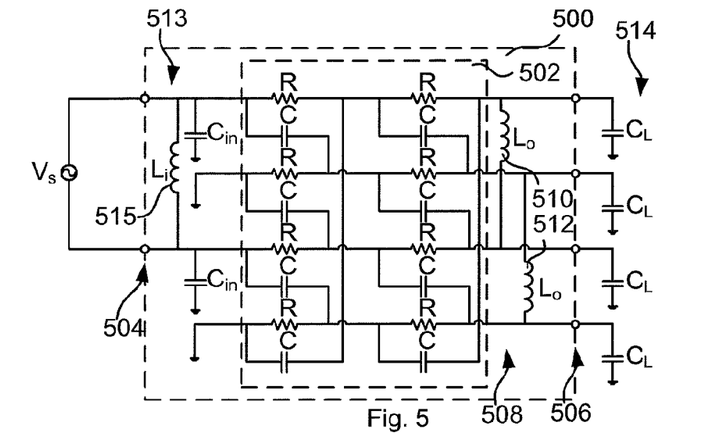
FIG. 5 illustrates a polyphase filter arrangement with inductor compensation arrangements connected at respective input and output terminals of the polyphase filter.

FIG. 5 illustrates a polyphase filter arrangement 500 with inductor compensation arrangements 513, 508 connected at respective input and output terminals 504, 506 of the polyphase filter. The polyphase filter arrangement 500 comprises similar elements as the polyphase filter arrangement 300 of FIG. 3, but where the input terminals 504 are connected to inputs of a first and a third of the RC units of an input stage of the polyphase filter 502, while inputs of a second and a fourth of the first order RC units of the input stage are connected to a signal ground. The output inductor compensation arrangement 508 may comprise a first inductor 510 connected between the first and third output terminals and a second inductor 512 connected between the second and fourth output terminals. In other senses, the structure is the same as demonstrated above, and the polyphase filter will function in a similar way with similar reduction of insertion loss. The output impedance will thus, at the operating frequency, be purely resistive, i.e. reactance is negligible in practice, and insertion loss due to capacitance of the capacitive element of each RC unit of the polyphase filter 502 and load capacitance 514 at the output will be reduced.

Figure 6:
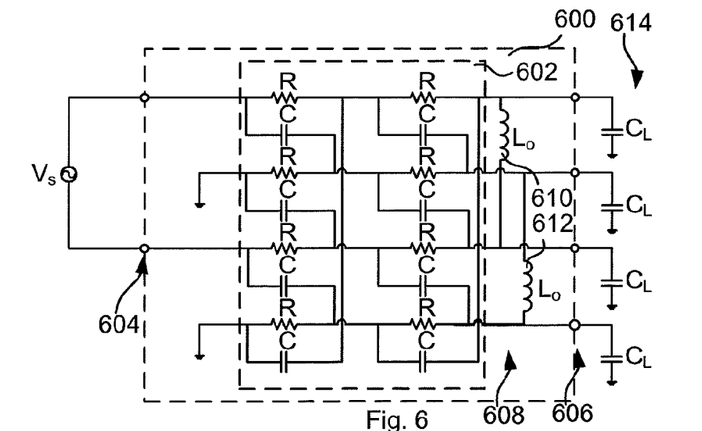
FIG. 6 illustrates a polyphase filter arrangement with an inductor compensation arrangement connected at output terminals of the polyphase filter.

FIG. 6 illustrates a polyphase filter arrangement 600 with an inductor compensation arrangement 608 connected at output terminals 606 of a polyphase filter 602. The polyphase filter arrangement 600 comprises similar elements as the polyphase filter arrangement 400 of FIG. 4, but where the input terminals 604 are connected to inputs of a first and a third of the RC units of an input stage of the polyphase filter 602, while inputs of a second and a fourth of the RC units of the input stage are connected to a signal ground. The output inductor compensation arrangement 608 may comprise a first inductor 610 connected between the first and third output terminals and a second inductor 612 connected between the second and fourth output terminals. In other senses, the structure is the same as demonstrated above, and the polyphase filter will function in a similar way with similar reduction of insertion loss. The output impedance will thus, at the operating frequency, be purely resistive, i.e. reactance is negligible in practice, and insertion loss due to capacitance of the capacitive element of each RC unit of the polyphase filter 602 and load capacitance 614 at the output will be reduced.

Here, it can be noted that one of the differences between the arrangements demonstrated with reference to FIGS. 2-4, and the arrangements demonstrated with reference to FIGS. 5-6 is that the input impedance is about R in the arrangements demonstrated with reference to FIGS. 2-4, while the input impedance is about 2·R in the arrangements demonstrated with reference to FIGS. 5-6, at operating frequency, where R is the resistance of the resistive element of each RC unit of the polyphase filter.

Here, it can further be noted that, for the arrangements demonstrated with reference to FIGS. 3-6, the first and second inductors 310, 312; 410, 412; 510, 512; 610, 612 are arranged to compensate for a capacitive load 314, 414, 514, 614 on the output terminals when in use such that reactance at the output is negligible in practice.

Figure 7:
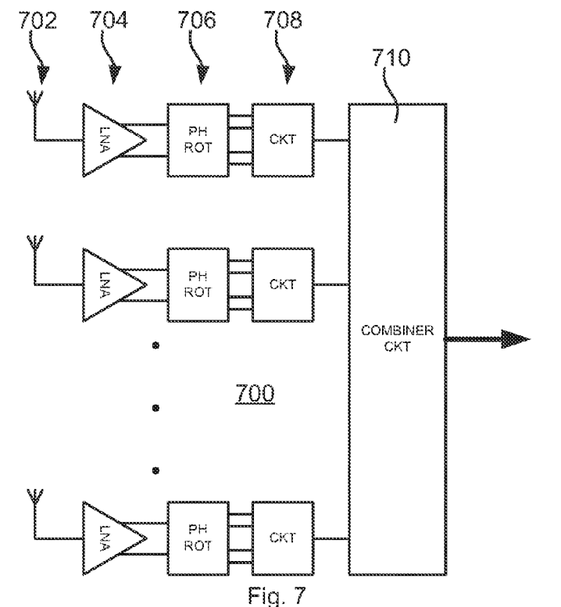
FIG. 7 is a block diagram schematically illustrating a beamforming arrangement for an antenna array.

FIG. 7 is a block diagram schematically illustrating a beamforming arrangement 700 for an antenna array 702. Beamforming in general is a well-known technique, and the purposes and signal processing for beamforming will not be demonstrated here for the sake of brevity since the skilled reader readily will know how to apply those parts. Instead, new circuitry for implementing phase rotation for beamforming will be suggested here. The beamforming arrangement 700 is arranged to be connected to the antenna array 702. The beamforming arrangement 700 is suitable for radio frequency, RF, operation. Each of the antennas of the antenna array 702 will receive a signal which signals are provided to respective LNAs 704, which in turn provides the amplified signals to respective phase rotators 706. The phase rotators 706 each utilize a polyphase filter arrangement as demonstrated above for providing different phase versions of the respective signals. The RF beamforming arrangement 700 thus comprises a plurality of quadrature signal generators according implemented by polyphase filter arrangements as demonstrated above and a vector modulator comprising an amplifier and a phase rotator connected to each quadrature signal generator. The amplifier and phase rotator are arranged to be controlled according to a beamforming control scheme. The phase rotated signals may then provided to respective further circuits 708, which for example may comprise further signal processing, and the respective signal paths are then joined by a combiner circuit 710. Through this structure, beamforming characteristics of the beamforming arrangement 700 are achieved.

Figure 9:
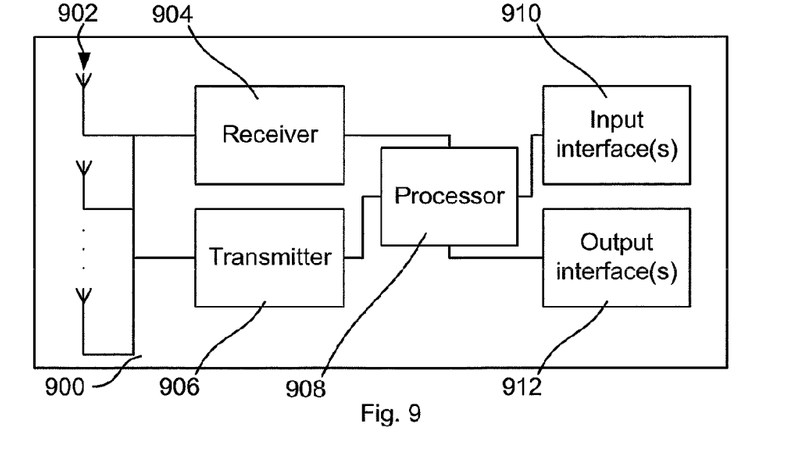
FIG. 9 is a block diagram schematically illustrating a communication device.
Figure 10:
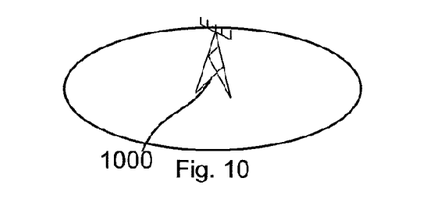
FIG. 10 schematically illustrates a base station.

FIG. 9 is a block diagram schematically illustrating a communication device 900 according to an embodiment. The communication device comprises an antenna arrangement 902, e.g. an antenna array, a receiver 904 connected to the antenna arrangement 902, a transmitter 906 connected to the antenna arrangement 902, a processing element 908 which may comprise one or more circuits, one or more input interfaces 910 and one or more output interfaces 912. The interfaces 910, 912 can be user interfaces and/or signal interfaces, e.g. electrical or optical. The communication device 900 may be arranged to operate in a wireless, e.g. cellular communication network. The processing element 908 can be arranged for signal processing to enable beamforming by the receiver 904 and the antenna arrangement 902, i.e. as demonstrated with reference to FIG. 7. The processing element may also be involved in controlling the interfaces 910, 912, executing applications, e.g. for signaling operations, etc. The communication device 900 may for example be a base station 1000, as illustrated in FIG. 10, arranged for example for cellular communication. The base station 1000 may also be arranged for point-to-point communication where the beamforming may be used for tuning proper directivity etc.

The invention has mainly been described above with reference to a few embodiments. However, as is readily appreciated by a person skilled in the art, other embodiments than the ones disclosed above are equally possible within the scope of the invention, as defined by the appended patent claims.

The invention claimed is:

1. A quadrature signal generator comprising:
a resistor-capacitor (RC) polyphase filter comprising:
a first and a second input terminal;
a first, a second, a third, and a fourth output terminal; and
a plurality of cascade-connected stages of RC units, each of the RC units comprising a resistive element and a capacitive element,
wherein a first end of each resistive element is set as an input, and a second end of each resistive element is set as an output for the respective stage, and
wherein the capacitive element of each RC unit is connected between the second end of the resistive element of that RC unit and the first end of the resistive element of a next one of the RC units,
wherein the capacitive element of a last one of the RC units is connected between the second end of the resistive element of the last one of the RC units of the stage and the first end of the resistive element of a first one of the RC units of the stage, and
wherein the plurality of cascade-connected stages of RC units comprises an input stage connected to the first and second input terminals and an output stage connected to the first, second, third, and fourth output terminals; and
an inductor compensation circuit connected at the output terminals, the inductor compensation circuit comprising a first inductor connected between the first and the third output terminals, and a second inductor connected between the second and fourth output terminals.

2. The quadrature signal generator of claim 1, wherein the first and second inductors of the inductor compensation circuit are configured to compensate for a non-zero capacitive load, at an operating frequency, such that there is provided only resistive impedance at the first, second, third, and fourth output terminals by resonating with the capacitive elements of the RC polyphase filter and the capacitive load.

3. The quadrature signal generator of claim 2, wherein:
each resistive element of the RC units of the RC polyphase filter has a resistance R;
each capacitive element of the RC units of the RC polyphase filter has a capacitance C; and the first and second inductors each have an inductance $L_o$ equal to $$\frac{1}{0.5(C+C_L)\omega^2},$$

where $\omega$ represents a non-zero angular frequency of the operating frequency and $C_L$ represents the expected non-zero capacitive load on each output terminal.

4. The quadrature signal generator of claim 1, comprising a second inductor compensation circuit connected at the input terminals, the second inductor compensation circuit comprising an input inductor connected between the first and the second input terminals.

5. The quadrature signal generator of claim 4, wherein the input inductor of the second inductor compensation circuit is configured to compensate for a non-zero capacitance at the input terminals, at an operating frequency, such that there is provided only resistive impedance at the first and second input terminals by resonating with the capacitive elements of the RC polyphase filter and the capacitance at the input terminals.

6. The quadrature signal generator of claim 5, wherein:
each resistance element of the RC units of the RC polyphase filter has a resistance R;
each capacitive element of the RC units of the RC polyphase filter has a capacitance C; and
the input inductor has an inductance $L_i$ equal to $$\frac{1}{0.5(C+C_{in})\omega^2},$$

where $\omega$ represents a non-zero angular frequency of the operating frequency and $C_{in}$ represents the expected non-zero capacitance to ground on each input terminal.

7. The quadrature signal generator of claim 1, wherein the first input terminal is configured to receive a first polarity of a signal, the second input terminal is configured to receive a second polarity of the signal, the first output terminal is configured to output a first polarity of an in-phase version of the signal, the second output terminal is configured to output a first polarity of a quadrature-phase version of the signal, the third output terminal is configured to output a second polarity of the in-phase version of the signal, and the fourth output terminal is configured to output a second polarity of the quadrature-phase version of the signal.

8. A beamforming circuit configured to be connected to an antenna array, the beamforming circuit comprising:
a vector modulator comprising an amplifier and a phase rotator, wherein the amplifier and phase rotator are configured to be controlled according to a beamforming control scheme and wherein the phase rotator comprises a quadrature signal generator comprising:
a resistor-capacitor (RC) polyphase filter comprising:
a first and a second input terminal;
a first, a second, a third, and a fourth output terminal; and
a plurality of cascade-connected stages of RC units, each of the RC units comprising a resistive element and a capacitive element,
wherein a first end of each resistive element is set as an input, and a second end of each resistive element is set as an output for the respective stage, and
wherein the capacitive element of each RC unit is connected between the second end of the resistive element of that RC unit and the first end of the resistive element of a next one of the RC units,
wherein the capacitive element of a last one of the RC units is connected between the second end of the resistive element of the last one of the RC units of the stage and the first end of the resistive element of a first one of the RC units of the stage, and
wherein the plurality of cascade-connected stages of RC units comprises an input stage connected to the first and second input terminals and an output stage connected to the first, second, third, and fourth output terminals; and
an inductor compensation circuit connected at the output terminals, the inductor compensation circuit comprising a first inductor connected between the first and the third output terminals, and a second inductor connected between the second and fourth output terminals.

9. The beamforming circuit of claim 8, wherein the first and second inductors of the inductor compensation circuit are configured to compensate for a non-zero capacitive load, at an operating frequency, such that there is provided only resistive impedance at the first, second, third, and fourth output terminals by resonating with the capacitive elements of the RC polyphase filter and the capacitive load.

10. The beamforming circuit of claim 9, wherein:
each resistive element of the RC units of the RC polyphase filter has a resistance R;
each capacitive element of the RC units of the RC polyphase filter has a capacitance C; and
the first and second inductors each have an inductance $L_o$ equal to $$\frac{1}{0.5(C+C_L)\omega^2},$$

where $\omega$ represents a non-zero angular frequency of the operating frequency and $C_L$ represents the expected non-zero capacitive load on each output terminal.

11. The beamforming circuit of claim 8, comprising a second inductor compensation circuit connected at the input terminals, the second inductor compensation circuit comprising an input inductor connected between the first and the second input terminals.

12. The beamforming circuit of claim 11, wherein the input inductor of the second inductor compensation circuit is configured to compensate for a non-zero capacitance at the input terminals, at an operating frequency, such that there is provided only resistive impedance at the first and second input terminals by resonating with the capacitive elements of the RC polyphase filter and the capacitance at the input terminals.

13. The beamforming circuit of claim 12, wherein:
each resistance element of the RC units of the RC polyphase filter has a resistance R;
each capacitive element of the RC units of the RC polyphase filter has a capacitance C; and
the input inductor has an inductance $L_i$ equal to $$\frac{1}{0.5(C+C_{in})\omega^2},$$

where ω represents a non-zero angular frequency of the operating frequency and $C_{in}$ represents the expected non-zero capacitance to ground on each input terminal.

14. The beamforming circuit of claim 8, wherein the first input terminal is configured to receive a first polarity of a signal, the second input terminal is configured to receive a second polarity of the signal, the first output terminal is configured to output a first polarity of an in-phase version of the signal, the second output terminal is configured to output a first polarity of a quadrature-phase version of the signal, the third output terminal is configured to output a second polarity of the in-phase version of the signal, and the fourth output terminal is configured to output a second polarity of the quadrature-phase version of the signal.

15. A communication device comprising a beamforming circuit configured to be connected to an antenna array, the beamforming circuit comprising:
  a vector modulator comprising an amplifier and a phase rotator, wherein the amplifier and phase rotator are configured to be controlled according to a beamforming control scheme and wherein the phase rotator comprises a quadrature signal generator comprising:
    a resistor-capacitor (RC) polyphase filter comprising:
      a first and a second input terminal;
      a first, a second, a third, and a fourth output terminal; and
      a plurality of cascade-connected stages of RC units, each of the RC units comprising a resistive element and a capacitive element,
        wherein a first end of each resistive element is set as an input, and a second end of each resistive element is set as an output for the respective stage, and
        wherein the capacitive element of each RC unit is connected between the second end of the resistive element of that RC unit and the first end of the resistive element of a next one of the RC units,
        wherein the capacitive element of a last one of the RC units is connected between the second end of the resistive element of the last one of the RC units of the stage and the first end of the resistive element of a first one of the RC units of the stage, and
        wherein the plurality of cascade-connected stages of RC units comprises an input stage connected to the first and second input terminals and an output stage connected to the first, second, third, and fourth output terminals; and
    an inductor compensation circuit connected at the output terminals, the inductor compensation circuit comprising a first inductor connected between the first and the third output terminals, and a second inductor connected between the second and fourth output terminals.

16. The communication device of claim 15 comprising a base station configured for cellular or point-to-point communication.

* * * * *